United States Patent [19]

Iguchi

[11] Patent Number: 5,233,452
[45] Date of Patent: Aug. 3, 1993

[54] LIQUID CRYSTAL DISPLAY DEVICE HAVING A MOLDING AGENT INCLUDING GLASS FIBERS THEREIN

[75] Inventor: Kazuo Iguchi, Suwa, Japan

[73] Assignee: Seiko Epson Corporation, Tokyo, Japan

[21] Appl. No.: 862,225

[22] Filed: Apr. 2, 1992

[30] Foreign Application Priority Data

Apr. 3, 1991 [JP] Japan .................................. 3-070871
Mar. 19, 1992 [JP] Japan .................................. 4-063284

[51] Int. Cl.$^5$ ............................................. G02F 1/133
[52] U.S. Cl. ......................................... 359/88; 359/79
[58] Field of Search .............................. 359/79, 87, 88

[56] References Cited

U.S. PATENT DOCUMENTS

| | | |
|---|---|---|
| 4,917,466 | 4/1990 | Nakamura et al. .................... 359/88 |
| 5,032,006 | 7/1991 | Grupp et al. .......................... 359/88 |
| 5,142,644 | 8/1992 | VanSteenkiste et al. ............. 359/88 |

FOREIGN PATENT DOCUMENTS

| | | | |
|---|---|---|---|
| 0059429 | 3/1986 | Japan | .................................... 359/88 |
| 0000518 | 1/1989 | Japan | .................................... 359/88 |
| 0206317 | 8/1989 | Japan | .................................... 359/88 |
| 1-206317 | 8/1989 | Japan | . |
| 1252936 | 10/1989 | Japan | .................................... 359/88 |
| 2-239232 | 9/1990 | Japan | . |

*Primary Examiner*—William L. Sikes
*Assistant Examiner*—Huy K. Mai
*Attorney, Agent, or Firm*—Oliff & Berridge

[57] ABSTRACT

In order to enhance the reliability of conduction between a connecting pin and an electrode terminal, glass beads and/or glass fibers are added to a molding agent. After the connecting pin is inserted into an electrode terminal portion of a glass substrate onto which the connecting pin abuts, the molding agent having the glass beads and/or glass fibers is formed and applied around the connecting pin so that the connecting pin is coated and secured to the electrode terminal.

18 Claims, 2 Drawing Sheets

LIQUID CRYSTAL DISPLAY DEVICE HAVING A MOLDING AGENT INCLUDING GLASS FIBERS THEREIN

BACKGROUND OF THE INVENTION

1. Field of the Invention

The present invention relates to a liquid crystal device such as a liquid crystal display device used, for example, in the fields of on-vehicle devices, measuring instruments, consumer devices, home electronics and the like, and more particularly to a liquid crystal device mainly used for devices which require a high endurance and quality.

2. Description of the Related Art

With regard to conventional liquid crystal devices having a connecting pin, a method of securing the connecting pin to an electrode terminal involves: a) arranging the connecting pin to abut the electrode terminal (which is provided at an edge of, for example, a glass substrate); and b) securing the connecting pin to the electrode terminal with a molding agent such as UV resin (ultra violet ray curing type resin) so that the connecting pin is coated. Some examples of UV resins typically employed include: acrylic resin, silicone resin, epoxy resin, etc. Currently, such a molding agent includes no additives.

In the conventional device described above, microscopic changes appear in the molding agent under specifications (conditions) requiring high endurance. These high endurance specifications include, for example, a high temperature test, a high humidity test, a low temperature soldering heat test and a thermal shock test. These microscopic changes occur due to thermal expansion, contraction, water absorption and the like of the molding agent coating the connecting pin.

These microscopic changes result in a rapid increase in the conduction resistance between the connecting pin and the electrode terminal, which causes problems such as display pattern loss and uneven contrast on the display device. Additionally, uneven cell gaps (uneven color tone) are generated on the display device because contraction of the molding agent occurs when the molding agent sets, causing abnormal changes in the cell gaps on the display device.

OBJECTS AND SUMMARY OF THE INVENTION

The present invention addresses the problems discussed above and makes it possible to suppress the thermal expansion of the molding agent and to suppress the contraction and water absorption of the molding agent by adding materials such as, for example, glass beads and/or glass fibers to the molding agent coating the connecting pin. Therefore, it is an object of the present invention to provide a liquid crystal display device having a high reliability which maintains a stable conduction resistance between a connecting pin and an electrode terminal and which has a high endurance.

To achieve the foregoing and other objects, and to overcome the shortcomings discussed above, a liquid crystal device which is made by arranging a connecting pin so that it abuts an electrode terminal disposed on an edge portion of a glass substrate and by coating the connecting pin with a molding agent, includes glass beads and/or glass fibers in the molding agent.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

Examples of liquid crystal display devices constructed according to the present invention will now be described in detail.

Figure 1:
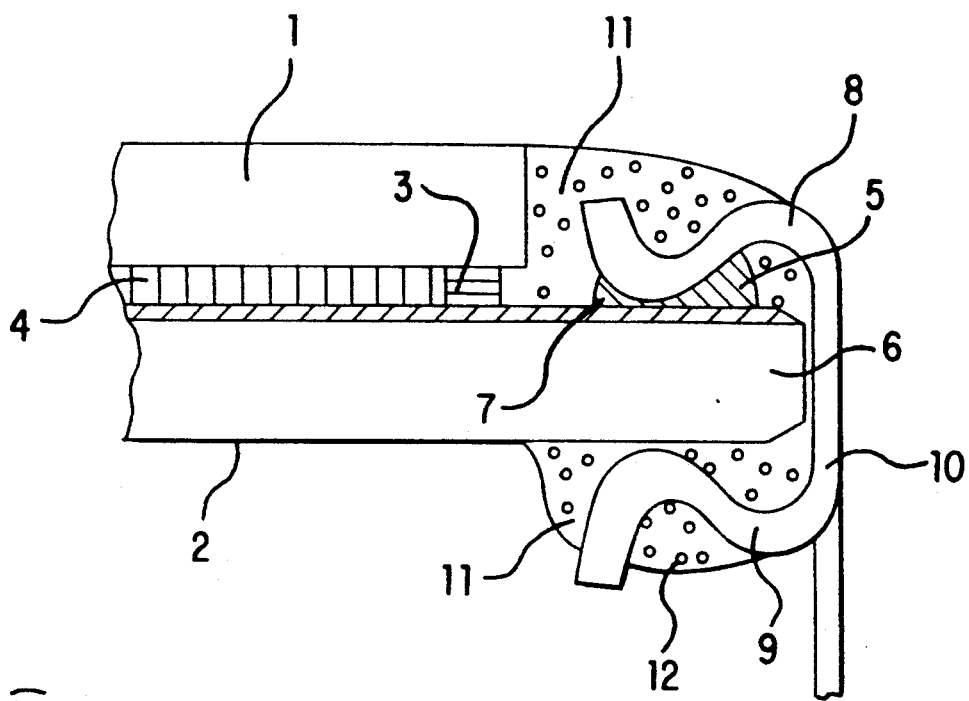
FIG. 1 is a side view of a liquid crystal display device having a connecting pin according to a first embodiment of the present invention.

FIG. 1 shows a liquid crystal display device according to a first embodiment of the present invention. The structure will be first described. An upper glass substrate 1 and a lower glass substrate 2 are retained in parallel by a spacer 3. Of course, other materials such as quartz or plastic can be used as substrates 1 or 2. A liquid crystal 4 of, for example, the twisted nematic (TN) type, supertwisted nematic (STN) type, the ferroelectric type, or the like, is sandwiched between the upper glass substrate i and the lower glass substrate 2. An electrode pattern 5 is formed on the lower glass substrate 2. Conductive paste 7 is applied on an electrode terminal 6 and, thereafter, a connecting pin 10 comprising an upper connecting pin clip 8 and a lower connecting pin clip 9 is forced to abut the electrode terminal 6 using, for example, a propulsion force provided by a cylinder or the like. A molding agent 11 comprised of, for example, the previously mentioned acrylic resin, silicone resin, epoxy resin, etc., is then applied to secure the connecting pin to the electrode terminal, causing the connecting pin 10 to be coated.

According to a first embodiment of the present invention, glass beads 12 are added to the molding agent 11. Preferably, the diameter of each bead is 5-50 $\mu$m, and the quantity added is in the range from 5 to 60 percent by weight of the molding agent 11.

With the structure according to the FIG. 1 embodiment, the conduction resistance between the connecting pin and the electrode pattern is stable even under conditions of, e.g.: 80° C.-90° %RH (relative humidity), repeated use between $-40°$ C. and 80° C., and $-60°$ C. Thus, it is possible to provide a liquid crystal display device which can suppress microscopic behavior usually caused by thermal expansion of the molding agent and the like to ensure a high degree of endurance.

Table 1 shows test results indicating the manner in which reliability is influenced by, and related to, the quantity of glass beads added to the molding agent under the following test conditions:

TABLE 1

| | |
|---|---|
| 1. Glass bead diameter | 0.02 mm |
| 2. Expansion coefficient of molding agent | $1.27 \times 10^{-4}/°K$. |
| 3. Connecting pin material | PBSR-$\frac{1}{2}$H solder-plated |

TABLE 1-continued

| | surface treatment | (Pb:Sn = 1:9) |
|---|---|---|
| 4. | Parameters of environmental test | 80° C.-90% RH |
| 5. | Environmental test time | 1500H (hours) |

| No. | Quantity added (%) | fraction defective (%) | Remarks |
|---|---|---|---|
| 1 | 0 wt % | 0.2 | Defects occured under the test conditions |
| 2 | 3 | 0.1 | No abnormality |
| 3 | 5 | 0 | No abnormality |
| 4 | 20 | 0 | No abnormality |
| 5 | 50 | 0 | No abnormality |
| 6 | 60 | 0 | No abnormality |
| 7 | 80 | 0 | Molding agent is not set sufficiently. Reduction in efficiency of operability. |

When no glass beads are added, only the thermal expansion coefficient of the molding agent is reflected in the test, resulting in 0.2 percent defective parts. It has been determined that when the quantity of glass beads added is in the range from 5 to 60 percent by weight, no defects occur.

Quartz glass, soda-lime glass and boro-silicate glass, for example, are suitable as the glass used for the glass beads, and preferably have a thermal expansion characteristic of $5-95 \times 10^{-7}/°C$. Further, it is preferable to use glass having a specific gravity ranging from 1.5 to 2.5 $g/cm^3$.

Figure 2:
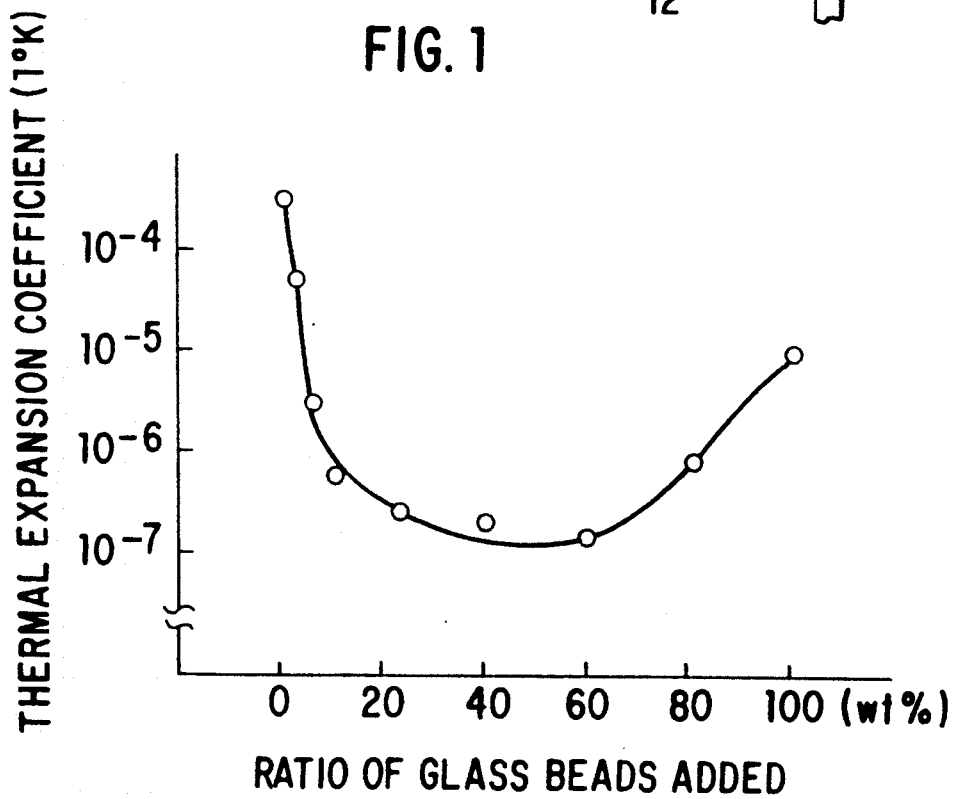
FIG. 2 shows a thermal expansion coefficient relative to the ratio of glass beads added to a molding agent according to the present invention.

FIG. 2 shows the data regarding the change in the thermal expansion coefficient of the molding agent relative to the ratio of the quantity of the glass beads added to the molding agent. It can be determined that the ratio of the added glass beads of 5-60 percent by weight is a preferable value from the viewpoint of the overall quality of the device.

In addition, while contraction of materials normally takes place when the molding agent sets, experimentation shows that reduction in the percentage of contraction down to 1 percent can be achieved for a type of resin (molding agent) which normally has a percentage of contraction of 5 percent. For other molding agents, reduction in the percentage of contraction of the molding agents by about 80 percent can be expected after the addition of glass beads as compared to the percentage of contraction of the molding agents without glass beads.

Figure 3:
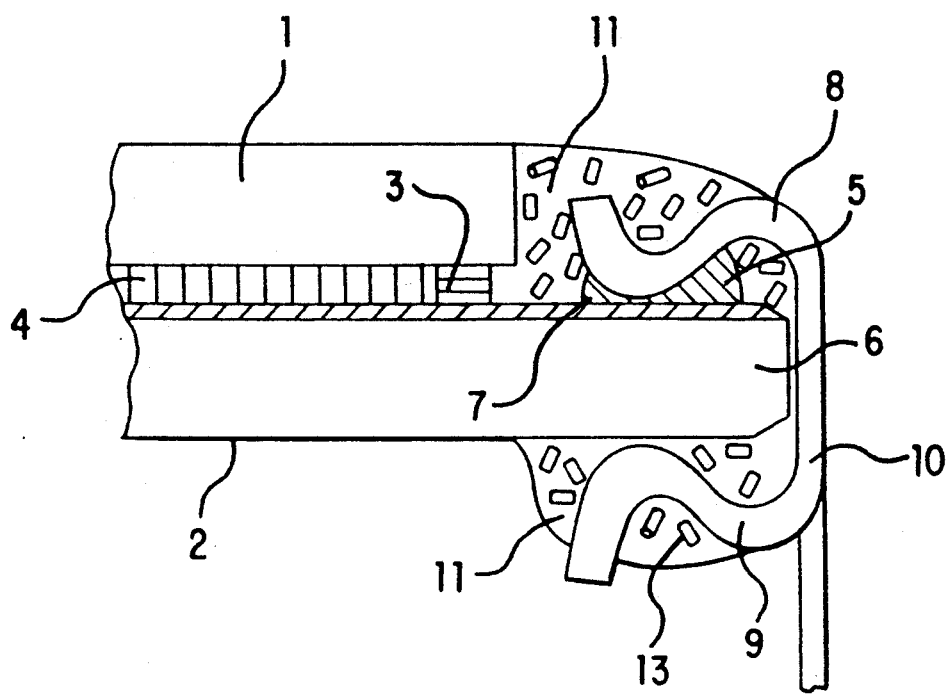
FIG. 3 is a side view of a liquid crystal display device having a connecting pin according to a second embodiment of the present invention.

FIG. 3 is a side view showing a liquid crystal display device according to a second embodiment of the present invention. The FIG. 3 embodiment is different from the FIG. 1 embodiment in that the material added to the molding agent 11 is glass fibers 13. The quantity of glass fibers 13 added to the molding agent 11 is preferably 5-60 percent by weight of the molding agent. The optimum parameters for the glass fiber as an additive are 5-50 μm in diameter and 20-200 μm in length.

Further, the contraction of the molding agent during a low temperature test (−40° C.) is reduced to about one third of that in the case of the glass beads. Therefore, this second embodiment can be considered to be very much preferable for specifications requiring low temperatures.

Figure 4:
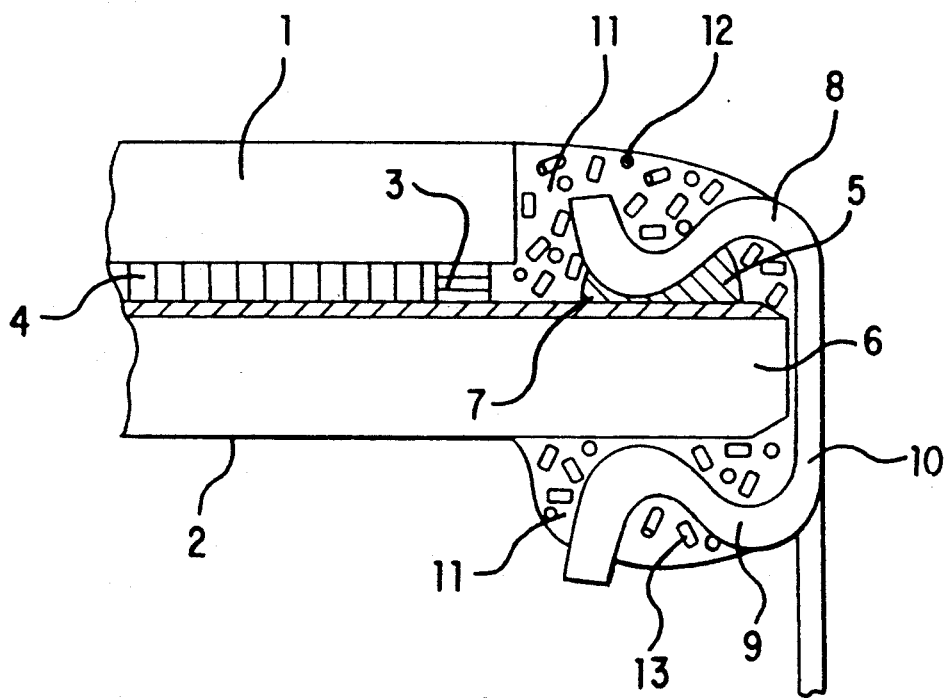
FIG. 4 is a side view of a liquid crystal display device having a connecting pin according to a third embodiment of the present invention.

FIG. 4 is a side view showing a liquid crystal display device according to a third embodiment of the present invention. While the FIG. 4 embodiment is similar to the FIG. 1 embodiment in appearance, it is characterized in that the glass beads 12 and the glass fibers 13 are mixed and added to the molding agent 11 as an additive.

Preferably, the glass beads 12 and the glass fibers 13 added to the molding agent 11 are mixed at a ratio of 50 percent to 50 percent. From the viewpoint of endurance, excellent characteristics are demonstrated in high temperatures and humidity, and in low temperatures. The ratio of each material added can be changed within the range from 20 to 80 percent in order to take advantage of the particular characteristics of the embodiments of FIG. 1 or FIG. 3.

The total quantity of additives preferably ranges from 5 to 60 percent by weight just as in the FIG. 1 and FIG. 3 embodiments.

As described above, the present invention has the advantage of suppressing expansion and contraction of a molding agent due to the addition of glass beads and/or glass fibers to the molding agent. Thus, a high degree of endurance is ensured for a liquid crystal display without reducing the conductivity of a connecting pin and an electrode pattern.

Further, there is another advantage that uneven cell gaps (uneven color tone) due to contraction of materials can be avoided when the molding agent sets.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A liquid crystal device having a connecting pin abutted with an electrode terminal disposed on an edge portion of a substrate, said connecting pin coated with and secured to said electrode terminal by a molding agent, wherein said molding agent includes glass fibers therein.

2. The liquid crystal device as defined in claim 1, wherein said glass fibers comprise 5-60 percent by weight of the molding agent.

3. The liquid crystal device as defined in claim 1, wherein glass beads are also included in said molding agent.

4. The liquid crystal device as defined in claim 3, wherein said glass beads have a diameter in the range from 5-50 μm.

5. The liquid crystal device as defined in claim 3, wherein said glass beads and said glass fibers each comprise at least 20% of a total glass particle content of said molding agent.

6. The liquid crystal device as defined in claim 3, wherein said glass beads and said glass fibers have a diameter in the range from 5-50 μm, and said glass fibers have a length in the range from 20-200 μm.

7. The liquid crystal device as defined in claim 1, wherein said glass fibers have a diameter in the range from 5-50 μm and a length in the range from 20-200 μm.

8. The liquid crystal device as defined in claim 1, wherein said glass fibers have a specific gravity in the range from 1.5-2.5 $g/cm^3$.

9. The liquid crystal device as defined in claim 1, wherein said glass fibers are selected from the group consisting of quartz glass fibers, soda-lime glass fibers, and boro-silicate glass fibers.

10. The liquid crystal device as defined in claim 1, wherein said glass fibers have a thermal expansion characteristic in the range from $5\text{-}95\times10^{-7}/°C$.

11. A liquid crystal device comprising:
an electrode terminal disposed on a substrate and attached to a liquid crystal located on said substrate;
a connecting pin abutted with said electrode terminal; and
a molding agent coating and securing said connecting pin to said electrode terminal, said molding agent having glass fibers dispersed therein.

12. The liquid crystal device as defined in claim 11, further comprising:
conductive paste located between a portion of said connecting pin and said electrode terminal.

13. The liquid crystal device as defined in claim 11, wherein said glass fibers comprise 5-60 percent by weight of the molding agent.

14. The liquid crystal device as defined in claim 11, wherein glass beads are also included in said molding agent.

15. The liquid crystal device as defined in claim 14, wherein said glass beads and glass fibers each comprise at least 20% of a total glass particle content of said molding agent.

16. The liquid crystal device as defined in claim 14, wherein said glass beads and said glass fibers have a diameter in the range from 5-50 μm, and said glass fibers have a length in the range from 20-200 μm.

17. The liquid crystal device as defined in claim 11, wherein said glass fibers have a thermal expansion characteristic in the range from $5\text{-}95\times10^{-7}/°C$.

18. A liquid crystal device comprising:
an electrode terminal disposed on a substrate and attached to a liquid crystal located on said substrate;
a connecting pin abutted with said electrode terminal; and
a molding agent coating and securing said connecting pin to said electrode terminal, said molding agent having glass fibers dispersed therein which have a diameter in the range from 5-50 μm, and a length in the range from 20-200 μm, said glass fibers comprising 5-60 percent by weight of the molding agent.

* * * * *